(12) United States Patent
Arakawa

(10) Patent No.: US 6,208,200 B1
(45) Date of Patent: Mar. 27, 2001

(54) LEVEL SHIFT CIRCUIT WITH LOW VOLTAGE OPERATION

(75) Inventor: Hideki Arakawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/114,097

(22) Filed: Jul. 13, 1998

(30) Foreign Application Priority Data

Jul. 14, 1997 (JP) .................................................... 9-188659

(51) Int. Cl.[7] .................................................. H03K 17/687
(52) U.S. Cl. .......................... 327/589; 327/534; 327/543; 365/189.09
(58) Field of Search .................................. 327/589, 536, 327/535, 534, 537, 333, 566, 543; 326/68, 80, 88; 365/185.18, 189.09, 226

(56) References Cited

U.S. PATENT DOCUMENTS

| | | | |
|---|---|---|---|
| 5,489,870 | * 2/1996 | Arakawa | 327/536 |
| 5,491,657 | * 2/1996 | Haddad et al. | 365/185.27 |
| 5,541,879 | * 7/1996 | Suh et al. | 365/185.22 |
| 5,740,107 | * 4/1998 | Lee | 365/185.11 |
| 5,770,963 | * 6/1998 | Akaogi et al. | 327/309 |
| 5,982,705 | * 11/1999 | Tsukikawa | 365/189.11 |

* cited by examiner

Primary Examiner—Timothy P. Callahan
Assistant Examiner—Terry L. Englund
(74) Attorney, Agent, or Firm—Ronald P. Kananen; Rader, Fishman, Grauer

(57) ABSTRACT

A level shift circuit capable of performing a low voltage operation without increasing the power consumption is described. A charge pump type level shift circuit incorporates NMOS transistors having well-in-well structures, where the potential of these wells are designed to rise along with the rise of the output voltage. The level shift circuit is capable of eliminating a back-bias effect and can lower the power source voltage to as low as 2V.

23 Claims, 9 Drawing Sheets

LEVEL SHIFT CIRCUIT WITH LOW VOLTAGE OPERATION

BACKGROUND OF THE INVENTION

1. Field of the Invention

The present invention relates to a level shift circuit which converts or shifts a voltage level to a different voltage level.

2. Description of the Related Art

In a semiconductor memory device, for example, in a flash memory having a single power source, a level shift circuit for converting or shifting a voltage level of a signal from the level of an external power source voltage $V_{DD}$ such as 5V to a high voltage level of, for example, 12V to 20V generated by an internal voltage boosting circuit, is used for generating a boost voltage $V_{PP}$ during a writing and a deleting operation of the flash memory in order to supply to a control system for writing and deleting.

Two kinds of circuits are known as a level shift circuit in a flash memory having a single power source.

A first circuit is a CMOS type circuit using n channel MOS (NMOS) transistor and p channel MOS (PMOS) transistor which have a high voltage tolerance.

A second circuit is a charge pump type circuit using only a MOS transistor, which can be either NMOS transistor or a PMOS transistor.

FIG. 11 is a circuit diagram illustrating the configuration of a CMOS type level shift circuit, and FIG. 12 shows input and output waveform characteristics of the circuit in FIG. 11.

As shown in FIG. 11, the CMOS type level shift circuit 1 comprises a PMOS transistor PT1 and an NMOS transistor NT1, and a PMOS transistor PT2 and an NMOS transistor NT2 which are connected in series between a high power source voltage $V_{pp}$ and the ground GND and an inverter INV1.

In this CMOS type level shift circuit, an input voltage $V_{in}$ having a level of a power source voltage $V_{dd}$ of, for example, 5V is supplied to a gate of the NMOS transistor NT1, is subjected to a level invention reaction in the inverter INV1, and is supplied to a gate of the NMOS transistor NT2 at the ground level.

Along with this, the NMOS transistor NT1 is turned on and the NMOS transistor NT2 is turned off. Accordingly, the potential of a node ND1 is drawn to the ground level. The ground level of the node ND1 is supplied to the gate of the PMOS transistor PT2 and the PMOS transistor PT2 is turned on. As a result, the output node ND2 is drawn to a high voltage $V_{pp}$. That is, the input voltage $V_{in}$ at a $V_{dd}$ level is converted to a high voltage of 20V and output as $V_{out}$.

Contrary to this, when the input voltage $V_{in}$ is input at 0V, the NMOS transistor NT1 is turned off and the NMOS transistor NT2 is turned on. Accordingly, the output node ND2 is drawn to the ground level. Namely, the input voltage $V_{in}$ at 0V is output as $V_{out}$ being unchanged at the ground level.

FIG. 13 is a circuit diagram showing the configuration of the charge pump type level shift circuit 10, and FIG. 14 shows the input and output waveform characteristics of the circuit in FIG. 13.

This level shift circuit 10 comprises, as shown in FIG. 13, a depletion type NMOS transistor NTd11, NMOS transistors NT11, NT12 and a capacitor C11 used as a voltage boost element.

The depletion type NMOS transistor NTd11 is connected between an input terminal $T_{in}$ and an output terminal $T_{out}$, and a gate thereof is connected to an input terminal $T_{S1}$ of a signal SIG1.

The gate of the NMOS transistor NT11 is connected to the output terminal $T_{out}$, and the drain is connected to the supply line of the high voltage power source $V_{pp}$, and the source is connected to the gate of the NMOS transistor NT12.

The drain of the NMOS transistor NT12 is connected to its own gate and also to one electrode of the capacitor C11, and the source is connected to the output terminal $T_{out}$.

The other electrode of the capacitor C11 is connected to the input terminal $T_{CLK}$ of a clock signal CLK.

In this charge pump type level shift circuit 10, when a signal SIG1 is held at the source voltage level and the input voltage $V_{in}$ is set at the level of power source voltage $V_{dd}$, the output voltage $V_{out}$ shifts to the level of approximate power source voltage $V_{dd}$.

In this state, when the signal SIG1 is lowered to 0V and the clock signal CLK is set to a high level which is the level of the power source voltage $V_{dd}$. The voltage VNp of the node Np of the source side (the gate side of the NMOS transistor NT12) of the NMOS transistor NT11 becomes in accordance with the formula:

$$VNp = V_{out} - V_{th(NT11)} + V_{dd}$$

where, $V_{th(NT11)}$ is a threshold voltage of the NMOS transistor NT11a.

As a result, the charge flows from the node Np through the NMOS transistor NT12 to the output terminal $T_{out}$ and the output voltage $V_{out}$ rises a little.

In a balanced state, the voltage of the node Np rises up to the level expressed by the following formula:

$$VNp = V_{out} + V_{th(NT12)}.$$

Here, if the level $V_{CLK}$ of the clock signal CLK is switched to the ground level, the voltage of the node Np follows in accordance with the following formula:

$$VNp = V_{out} + V_{th(NT12)} - V_{dd}.$$

Namely, the voltage of the node Np on the source side of the NMOS transistor NT11 becomes lower than the output voltage $V_{out}$.

As a result, the charge flows from the power source of the high voltage $V_{pp}$ through the NMOS transistor NT11 to the node Np and the formula $VNp = V_{out} - V_{th(NT11)}$ applies in the balanced state.

By repeating the above operation, the output voltage $V_{out}$ rises little by little/gradually each time when the clock signal CLK is switched from a high level to a low level.

The CMOS type level shift circuit shown in FIG. 11 performs well at a low voltage because it does not suffer from a disadvantage of so called back-bias effect, and there is an advantage that the maximum voltage of the transistor therein is equal to the high voltage $V_{pp}$. Also, the CMOS type level shift circuit performs well in a high speed operation and performs well with low power consumption.

However, it suffers from the disadvantage that the processing steps and the number of masks increase so that the cost rises.

The most advantageous point of the charge pump type level shift circuit such as shown in FIG. 13 is that the cost can be low because neither a PMOS transistor nor an NMOS transistor having high voltage tolerance are used, so that less processing steps and masks are required.

Due to this advantage of low cost, the charge pump type level shift circuit is applied in the NAND type flash memory.

However, this circuit does not perform well in a low voltage operation because of the rise of the threshold voltage $V_{th}$ which is caused by a back-bias effect of the transistor therein. Also, the maximum voltage applied to the transistor in the circuit becomes as much as $V_{pp}+V_{dd}$, thus, it is difficult to design the processing of the transistor.

With the recent development in lowering voltages of power sources, especially of portable equipment, it is becoming difficult to meet the requirement of making the threshold voltage ($V_{th}$) low in the NMOS transistor of the circuit shown in FIG. 13. When the power source voltage $V_{dd}$ is 3V or more, it can be applied by lowering the threshold voltage ($V_{th}$) of the transistor. However, in reality, $V_{dd}$ cannot be applied when the power source voltage $V_{dd}$ is lower than 2V.

Below, an explanation will be made more in detail on this matter.

First, the required limiting conditions to the circuit of FIG. 13 include the following two items.

1: In order to raise the output voltage $V_{out}$ to a level of the high voltage $V_{pp}$, the formula, $V_{th(NT11)}(V_{bb}+V_{pp})+V_{th(NT12)}(V_{BB}=V_{pp}) \leq V_{dd}$, should be applied.

Accordingly, $V_{th}$ ($V_{BB}=V_{pp}$) has to be small to lower the voltage.

2: Before the clock signal CLK energizes the capacitor C11, it is necessary to convey the $V_{dd}$ level of the signal SIG1 to the output terminal $T_{out}$ side and attain the level of at least $V_{out} \geq V_{th(NT11)}$ ($V_{BB}=0V$)

When the above condition is not met, The NMOS transistor NT11 is held cut off and the level converting operation does not start.

Accordingly, in order to lower the voltage, the threshold voltage $V_{th}$ of the NMOS transistor NTd11 has to be made small.

In the circuit of FIG. 13, in order to deal with this matter, a depletion type transistor is provided, however, in such cases, it is required to meet the formula, $|V_{th(NT11)}$ ($V_{BB}=V_{dd}$)$| \leq V_{dd}$ (min).

When this condition is not met, an electricity leakage occurs on the supply side of the signal SIG1 even if the voltage at the gate is 0V.

As mentioned above, the transistors composing a charge pump type level shift circuit must meet many limiting conditions.

Regarding the above item 2, the lowering of the voltage is no longer a problem because of the introduction of the depletion type transistor. However, the item 1 would be a difficult subject.

With regard to the above item 1, the case where $V_{dd}=1.8V$ will be considered below.

Supposing the NMOS transistors NT11 and NT12 are the same enhancement type transistors, it must meet the formula, $V_{th}(V_{BB}=V_{pp}) \leq 0.9V$. But in the case where $V_{pp}=20V$, the condition requires the value that $V_{th}$ ($V_{BB}=0V$) $\approx -0.1$ to $-0.5V$.

However, when the threshold voltage $V_{th}$ of the NMOS transistors NT11 and NT12 become negative and when the condition is that VSIG1=0V, a problem arises that the current leaks from the supply source having the high voltage $V_{pp}$ through the NMOS transistor NT11, the NMOS transistor NT12, and NMOS transistor NTd11 to the input In.

Accordingly, it is impossible to define the threshold voltage of both of the NMOS transistors NT11 and NT12 as $V_{th}$ as $V_{th}<0$.

Therefore, it is desired to use an enhancement type transistor of $V_{th}$ ($V_{BB}=0V$)=0.5 to 0.8V, which is also used in other peripheral circuits, as the NMOS transistor NT12, and to use a special transistor as the NMOS transistor NT11. However, it is difficult to adopt such transistors because the threshold voltage $V_{th}$ of the ordinary enhancement type transistor widely varies such as $V_{th}$ ($V_{BB}=V_{pp}$ 1.5 to 1.8V.

Also, there is a high probability that the NMOS transistor NT11 requires a depletion type transistor having a special voltage of $V_{th}$ ($V_{BB}=V_{pp}$) $\leq 0V$.

The threshold voltage of the NMOS transistor NT11 is $V_{th}$ ($V_{BB}=0V$)=approximately $V_{dd}/2=-1V$, accordingly, the $V_{th}$ =0 when $V_{BB}=20V$. However, both are not always commonly used.

When the threshold voltage $V_{th}$ ($V_{BB}=V_{pp}$) of the NMOS transistor NT12 is negative voltage and depressed, when the capacitor C11 raises the voltage of the node Np over the level of $V_{pp}+V_{th}$, the current leakage occurs from the node Np through the NMOS transistor NT11 to the supply source of the high voltage $V_{pp}$.

As a result, the speed of rising the output voltage $V_{out}$ becomes slow when the output voltage $V_{out}$ comes close to the level of high voltage $V_{pp}$. Thus, it takes more time to reach the state where $V_{out}=V_{pp}$.

Note that it can be considered to use an ordinary enhancement type transistor for the NMOS transistor NT11 and a depletion type transistor for the NMOS transistor NT12. However, in this case, the boosted charge flows in reverse from the output terminal $T_{out}$ through the NMOS transistor NT12 to the node Np so that the overall speed of rising the output voltage $V_{out}$ becomes slower.

In the above case, an explanation was made of an example in which the power source voltage $V_{dd}$ is 1.8V, and this is the lowest possible figure for the ordinary means. When the power source voltage $V_{dd}$ is lower than the above, it is necessary to prepare four kinds of threshold voltages $V_{th}$ (applied for an enhancement circuit and a depletion circuit for other peripheral circuits and a level shift circuit). In addition, it is difficult to control the variation of threshold voltage $V_{th}$ in a small range.

SUMMARY OF THE INVENTION

An object of the present invention is to provide a level shift circuit capable of low voltage operation without increasing the power consumption.

According to the present invention, there is provided a level shift circuit for shifting a first level of a first voltage applied to an input terminal, to a second level of a second voltage higher than the first level and output to an output terminal, comprising: a capacitance element applied a boost pulse signal for boosting a voltage at a terminal thereof; a first field effect transistor (FET) of a first conductive type, having a first terminal connected to the input terminal applied the first voltage and a second terminal connected to said output terminal; a second FET of the first conductive type, having a first terminal connected to another terminal of the capacitance element, a second terminal connected to the output terminal, and a gate connected to the capacitance element; a third FET of the first conductive type, having a first terminal connected to a gate of the second FET, a second terminal connected to a voltage source, and a gate thereof connected to the output terminal; a well potential adjustment circuit; and a first well of the first conductive type, at least, the second FET having a second well of a second conductive type being formed in the first well, and being formed as a well-in-well type FET, the well potential adjustment circuit raising the potential of the second well in response to a voltage of said output terminal.

Preferably, the first FET is a depletion type transistor.

Preferably, the third FET is a depletion type transistor.

Preferably, the well potential adjustment circuit comprises a fourth FET of the first conductive type connected between a terminal of the first FET and the second well, and whose gate is connected to the second terminal.

Alternatively, the well potential adjusting circuit comprises a fourth FET of the first conductive type connected between a terminal of the second FET and the second well, and whose gate is connected to the output terminal.

Preferably, the fourth FET is formed in the second well of the second conductive type formed in the first well of the first conductive type.

Preferably, the well potential adjustment circuit comprises a fourth FET of the first conductive type connected to a $V_{pp}$ and whose gate is connected to the junction of the capacitance element and the second FET.

Preferably, there is provided a depletion type fifth FET of the first conductive type connected between the third FET and the second terminal, and whose gate is connected to the second terminal.

Preferably, the well potential adjusting circuit comprises a fourth FET of the first conductive type connected between a terminal of the capacitance element and the second FET and the second well, and whose gate is connected to the second terminal.

Preferably, there is provided a depletion type fifth FET of the first conductive type connected to the FET and whose gate is connected to the second terminal.

Alternatively, the well potential adjusting circuit comprises a resistor element connected between the junction of the capacitance element and the second FET and the second well.

Preferably, the level shift circuit is used in a memory device of single power source type, the input terminal is a terminal to which a voltage from an external power source is applied, and the output terminal is a terminal for an internal power source for using a voltage at a converted level for a memory operation. A pulse signal for boosting a voltage applied to the capacitance element is a clock signal in the memory device.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Below, preferred embodiments will be described with reference to the accompanying drawings.

Figure 1:
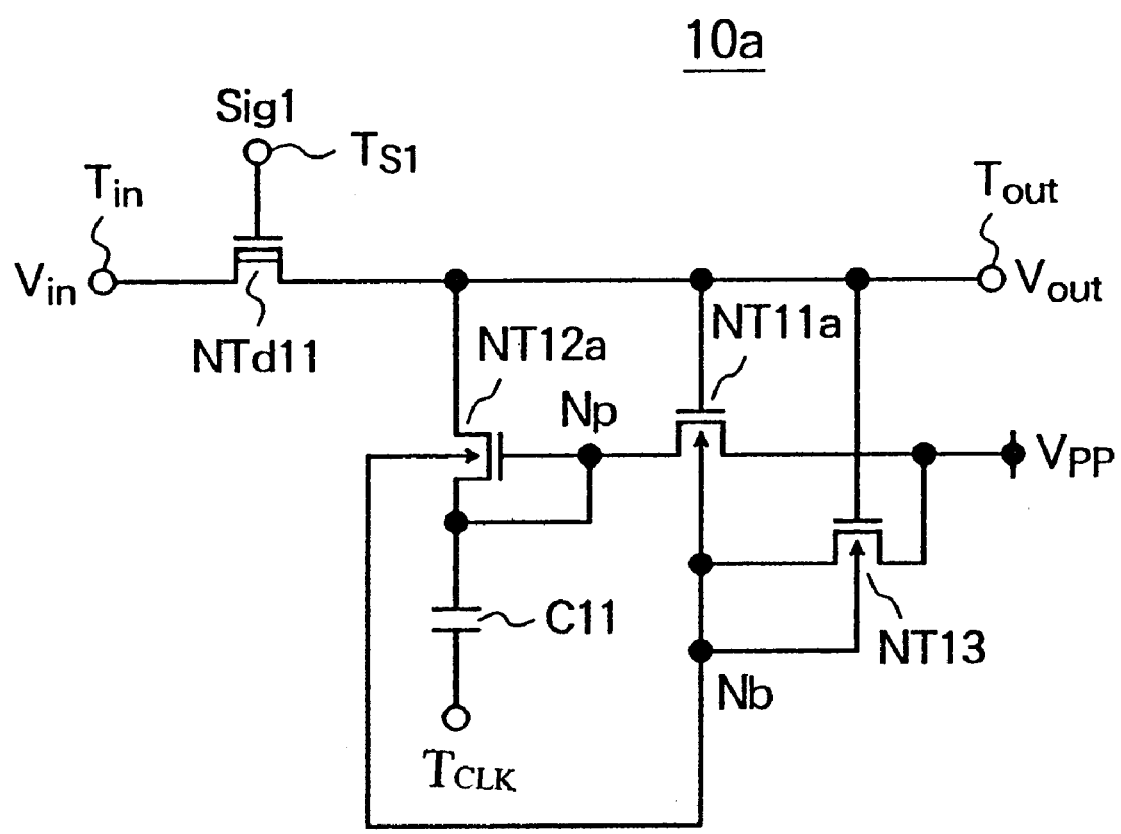
FIG. 1 is a circuit diagram of the first embodiment of the level shift circuit according to the present invention.
Figure 13:
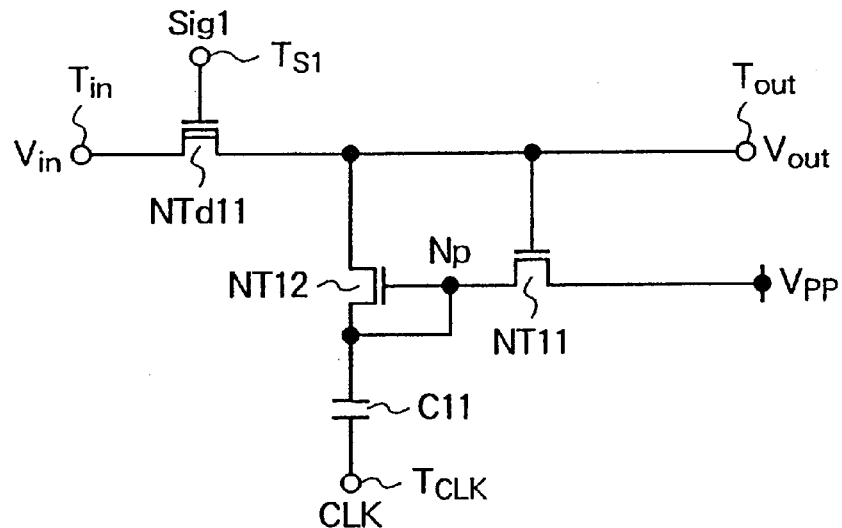
FIG. 13 is a circuit diagram of an example of the configuration of the charge pump type level shift circuit of the related art.
Figure 14:
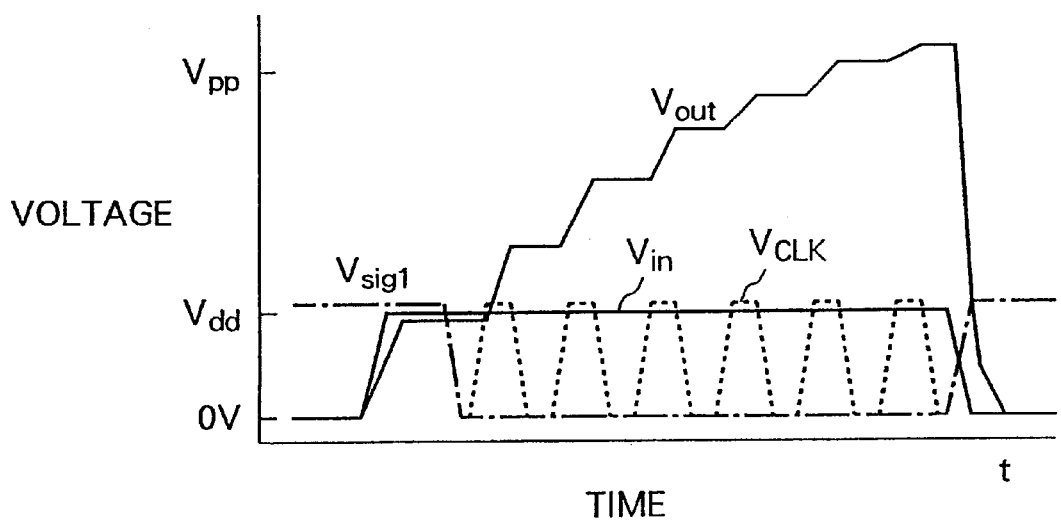
FIG. 14 is a view of the waveforms showing the input and output characteristics of the circuit of FIG. 13.

FIG. 1 is a circuit diagram of the first embodiment of the level shift circuit according to the present invention, wherein the same numerals are used for the same components as in FIG. 13 showing the example of the related art.

A level shift circuit 10a in FIG. 1 comprises a depletion type NMOS transistor NTd11 as a first field effect transistor, an NMOS transistor NT11a as a third field effect transistor, an NMOS transistor NT12a as a second field effect transistor, a capacitor C11 as a voltage boosting element, and an NMOS transistor NT13 as a fourth field effect transistor composing a circuit for adjusting a well potential.

Figure 2A:
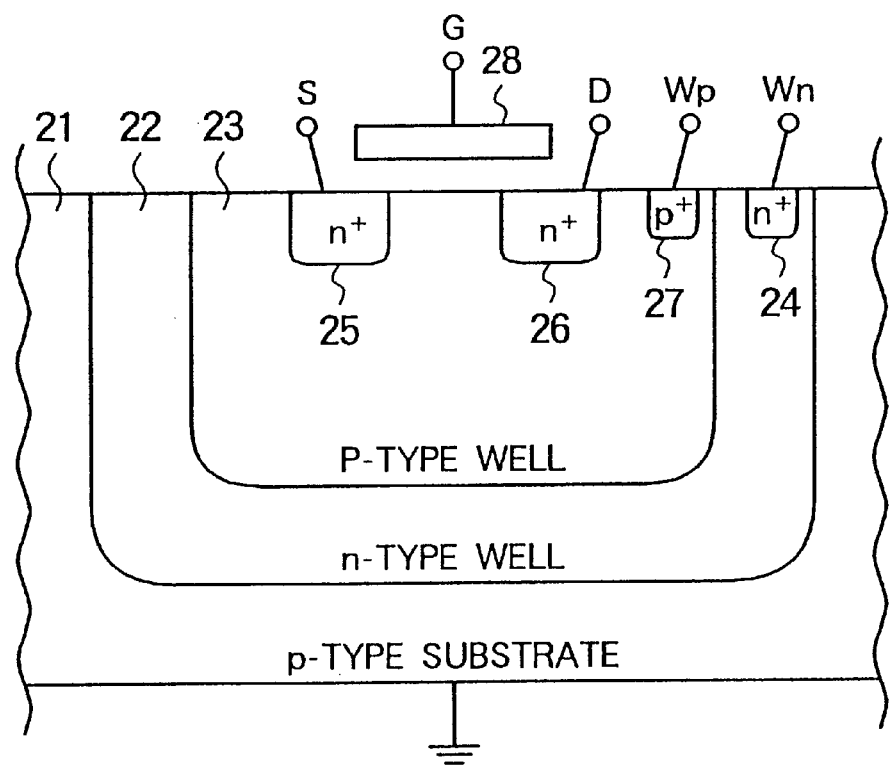
FIG. 2A is a schematic sectional view of a semiconductor device of a well-in-well structure.

The NMOS transistors NT11a to NT13 used in the present circuit are formed within a similar p-type well of a so called well-in-well (triple well) structure as shown in FIG. 2A.

Below, an explanation will be made of the basic configuration of the well-in-well structure with reference to FIG. 2.

Figure 2B:
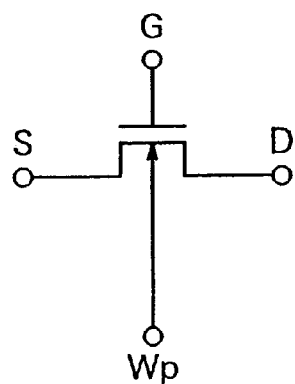
FIG. 2B is a view illustrating a circuit of FIG. 2A.

FIGS. 2A and 2B are schematic diagrams of the basic configuration of the well-in-well structure applied in the present embodiment. FIG. 2A is a simplified sectional view and FIG. 2B is a view of the NMOS transistor having the well-in-well structure using circuit destinations S (source), (Gate) and D (Drain).

In FIG. 2A, the reference number 21 represents p-type semiconductor substrate, the reference number 22 represents an n-type well, the reference number 23 represents a p-type well, the reference numbers 24 to 26 represent n+-type diffusion layers, the reference number 27 represents a p+-type diffusion layer, and the reference number 28 represents a gate electrode.

On the surface of the semiconductor substrate 21 composed of a grounded single crystalline silicon substrate, etc., the n-type well 22 as a substrate side diffusion layer is formed, and the n+ type diffusion layer 24 is formed on the surface of the n-type well 22.

Further, the p-type well 23 is formed within the n-type well 22. The n+-type diffusion layers 25, 26 of the element side and the p+-type diffusion layer 27 for a lead electrode are formed on the surface within the p-type well 23.

The n+ diffusion layers 25, 26 and the gate electrode 28 compose the NMOS transistor in which, for example, the n+-type diffusion layer 25 serves as a source and the n+-type diffusion layer 26 serves as a drain.

FIG. 2B is, as mentioned above, a view of the NMOS transistor having such well-in-well structure illustrated with circuit designations.

Note that, in this circuit, a terminal Wn is connected to a terminal Wp or held in the floating state.

Below, an explanation will be made of the connection relationship of the circuit in FIG. 1 which uses an NMOS transistor having the above-mentioned well-in-well structure.

The depletion type NMOS transistor NTd11 is connected between the input terminal Tin and the output terminal $T_{out}$, and a gate thereof is connected to the input terminal $T_{S1}$ of the signal SIG1.

The gate of the NMOS transistor NT11a is connected to the output terminal $T_{out}$, the drain is connected to the supply line of the high voltage power source $V_{pp}$, and the source is connected to the gate of the NMOS transistor NT12a.

The drain of the NMOS transistor NT12a is connected to its own gate and one electrode of the capacitor C11, and the source is connected to the output terminal $T_{out}$.

The other electrode of the capacitor C11 is connected to the input terminal $T_{CLK}$ of the clock signal CLK.

The source of the NMOS transistor NT13 is connected to the supply line of the high voltage $V_{pp}$, the drain is commonly connected to terminals Wp of the NMOS transistors NT11a and NT12a, and the gate is connected to the output terminal $T_{out}$.

Namely, in the present circuit, the well-in-well structure is applied to the NMOS transistors NT11a, NT12a and NT13, and the potentials of these well (p-type well 23) are designed to rise in accordance with the rise of the output voltage $V_{out}$.

Figures 3A, 3B, 3C:
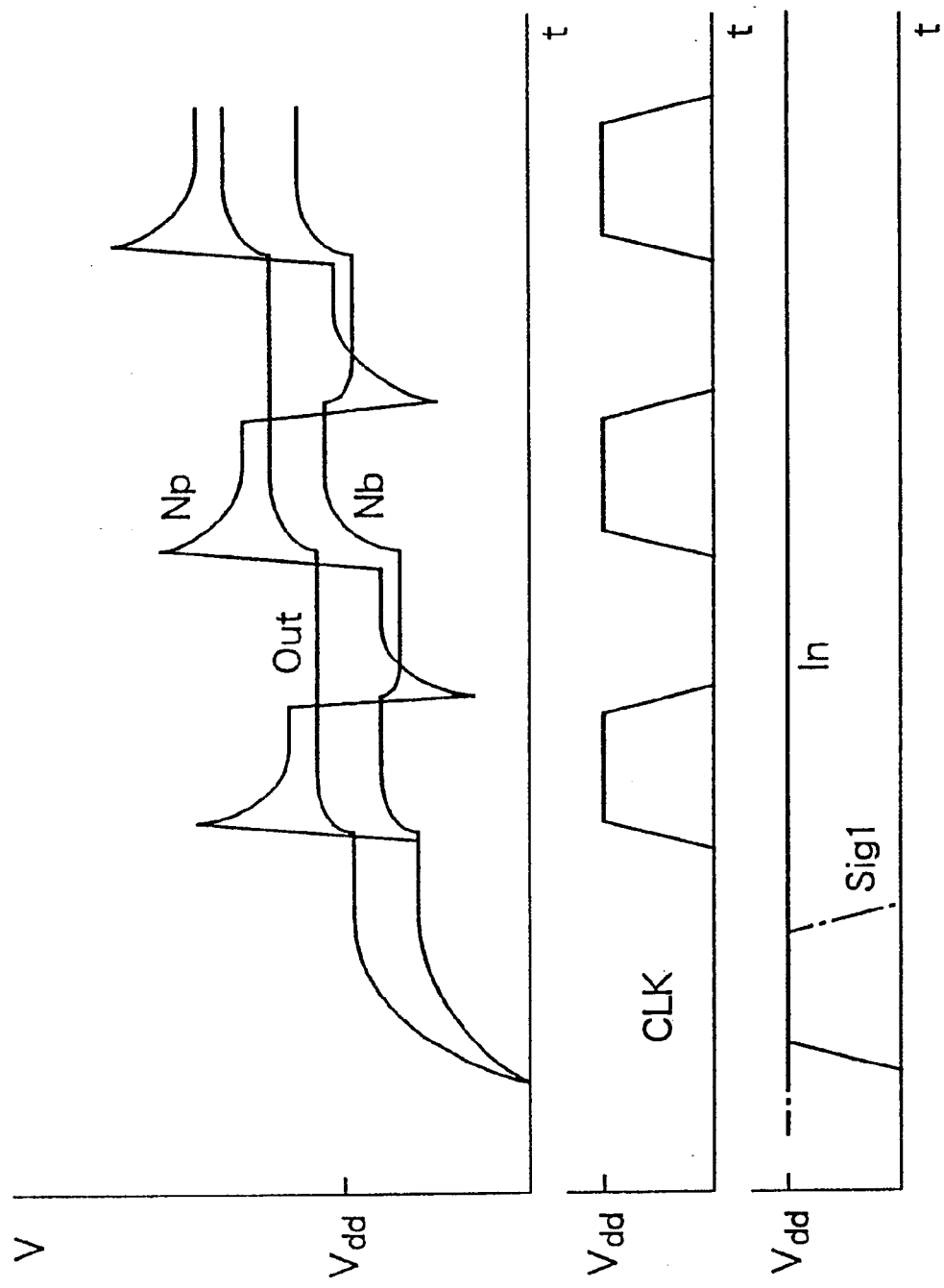
FIGS. 3A to 3C are timing charts for explaining the operation of the circuit of FIG. 1.

Next, the operation of the above structure will be explained with reference to FIG. 3.

First, when the input voltage $V_{in}$ is 0V, the connecting node Nb which connects the NMOS transistor NT13 and each well is in a floating state and becomes the level of 0V ($V_{sub}=V_{WN}=V_{WP}$) due to a junction leakage in a balanced state.

Then, the input voltage is set at the level of the power source voltage $V_{dd}$ and, after a certain time lapsed, it becomes the voltage level of the node Nb of immediately after the signal SIGI becomes 0V, that is $VNb=V_{dd}-V_{th(NT13)}$. Here, $V_{th(NT13)}$ is a threshold voltage of the NMOS transistor NT13.

When the clock signal CLK is set at a high level of the power source voltage $V_{dd}$, the voltage VNp of the node Np on the source side of the NMOS transistor NT11a (the gate side of the NMOS transistor NT12a) follows the formula, $VNp=V_{out}-V_{th(NT11a)}+V_{dd}$. Here, $V_{th(NT11a)}$ is a threshold voltage of the NMOS transistor NT11a.

As a result, the charge flows from the node Np through the NMOS transistor NT12a to the output terminal $T_{out}$ and the output voltage $V_{out}$ rises a little.

In a balanced state, the voltage of the node Np rises up to the level of the formula, $VNp=V_{out}+V_{th(NT12a)}$. Here, $V_{th(NT12a)}$ is a threshold voltage of the NMOS transistor NT12a.

When the level VCLK of the clock signal CLK is switched to the ground level of 0V, the voltage of the node Np becomes as expressed in the formula, $VNp=V_{out}+V_{th(NT12a)}-V_{dd}$. That is, the voltage of the node Np on the source side of the NMOS transistor NT11a becomes lower than the output voltage $V_{out}$.

As a result, the charge flows from the power source of the high voltage $V_{pp}$ through the NMOS transistor NT11a to the node Np and the formula, $VNp=V_{out}-V_{th(NT11a)}$, is applied in a balanced state.

At the point when the clock signal CLK is switched to the low level, the condition becomes $VNb=V_{out}-V_{th(NT13)} > VNp=V_{out}+V_{th(NT12)}-V_{dd}$. Accordingly, it comes to the state that the current flows from p-type well to the source of the NMOS transistor NT11a and the drain of the NMOS transistor NT12a. A latch up problem can be avoided by assuring a firm well contact.

After this, by repeating the above operation, the output voltage $V_{out}$ rises little by little/gradually each time the clock signal CLK is switched from a high level to a low level.

Along with the rise of the output voltage $V_{out}$, the voltage of the p-type well also rises according to the formula $VNp=V_{out}-V_{th(NT13)}$, however, the well corresponds to the substrate (Sub) of the NMOS transistor NT13 and the condition is $V_{source}$ (source voltage)=Vp– well potential. Thus, it is always in the state that the back-bias is assured only by $V_{th}$ ($V_{BB}$=0V), therefore.

In the present circuit, almost all the back-bias effect can be canceled.

Note that if the n-type well 22 is in a floating state, the voltage VNb of the node Nb rises to the level of about 0.6V. Therefore, even if the input voltage $V_{in}$ is at a low level, voltage remains, but it will be decreased by leakage afterwards.

As explained above, according to the first embodiment, in the charge pump type level shift circuit, the well-in-well structure is applied to the NMOS transistors NT11a, NT12a and NT13 and the potentials of these wells (p-type well 23) are designed to rise along with the rise of the output voltage $V_{out}$. Therefore, the back bias effect can be eliminated, and it is possible to easily apply a power source voltage to as low as 2V.

As a result, for example, in an IC using an internal power source supplied from a voltage boosting circuit such as low voltage flash memory, there is an advantage that a level shift circuit for converting the external power source of a low voltage level to the internal power source of a higher voltage level and which is applicable to the power source as low as 2V can be realized almost without increasing the cost and power consumption.

Second Embodiment

Figure 4:
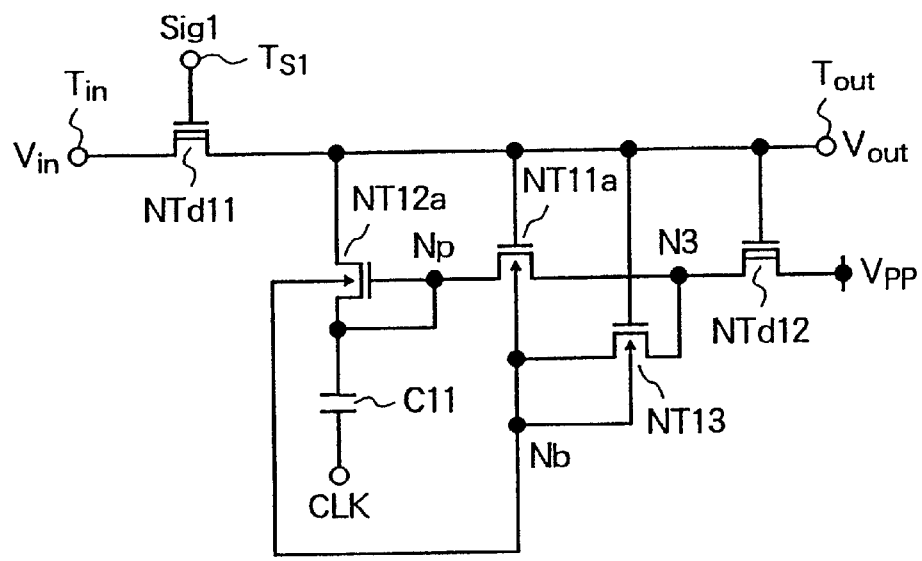
FIG. 4 is a circuit diagram of the second embodiment of the level shift circuit according to the present invention.

FIG. 4 is a circuit diagram of the second embodiment of the level shift circuit according to the present invention.

A different point of the present second embodiment from the first embodiment is, instead of connecting the connecting node N3 of the drain of the NMOS transistor NT11a and the source of the NMOS transistor NT13 directly to the supply line of the high voltage $V_{pp}$, the NMOS transistor NTd12 serving as a depletion-type fifth field effect transistor and gate thereof is connected to the output terminal $T_{out}$ and is thereby operationally connected to the supply line of high voltage $V_{pp}$.

The present circuit is for the case when the voltage tolerance of a source/drain and p-type well of a transistor having a well-in-well structure is lower than the high voltage $V_{pp}$.

In this structure, the drain voltage of the NMOS transistor NT11a, that is the voltage of the node N3 is suppressed as in the formula, $VN3=V_{out}+|V_{th(NTd12a)}|$.

Accordingly, a cell array of the NAND type flash memory is formed by the well-in-well structure same as in FIG. 2. however, the voltage tolerance between the source/drain of the transistor against the p-type well, and the p-type well against the n-type well are not required to be high. Therefore, it is possible to use the same well.

Third Embodiment

Figure 5:
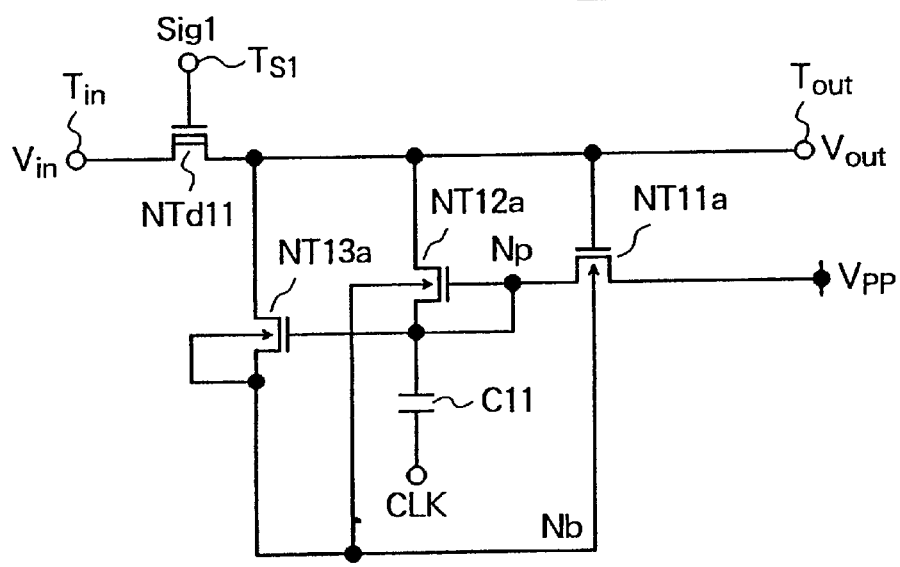
FIG. 5 is a circuit diagram of the third embodiment of the level shift circuit according to the present invention.

FIG. 5 is a circuit diagram of the third embodiment of the level shift circuit according to the present invention.

A different point of the present third embodiment from the above first embodiment is, instead of connecting the NMOS transistor NT13a serving as a fourth field transistor composing a well potential adjustment circuit between the p-type well and the supply line of the high voltage $V_{pp}$, the NMOS transistor NT13a is connected between the p-type well of each NMOS transistors NT11a, NT12a and NT13a and the output terminal T$_{out}$, and connecting a gate thereof to one electrode of the capacitor C11.

According to the third embodiment, the same effect can be obtained as the above first embodiment.

Fourth Embodiment

Figure 6:
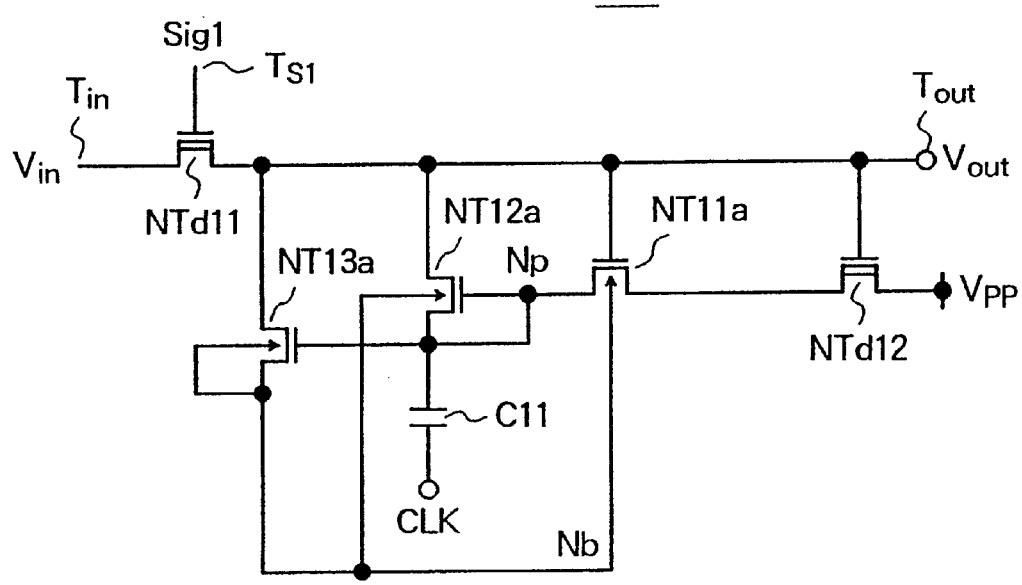
FIG. 6 is a circuit diagram of the fourth embodiment of the level shift circuit according to the present invention.

FIG. 6 is a circuit diagram of the fourth embodiment of the level shift circuit according to the present invention.

A different point of the present embodiment from the above third embodiment is, instead of connecting the drain of the NMOS transistor NT11a directly to the supply line of the high voltage V$_{pp}$, the drain is operationally connected to the NMOS transistor NTd12 serving as a depletion type fifth field effect transistor and a gate thereof is connected to the output terminal T$_{out}$.

According to the present fourth embodiment, the same effect can be obtained as the above first and second embodiments.

Fifth Embodiment

Figure 7:
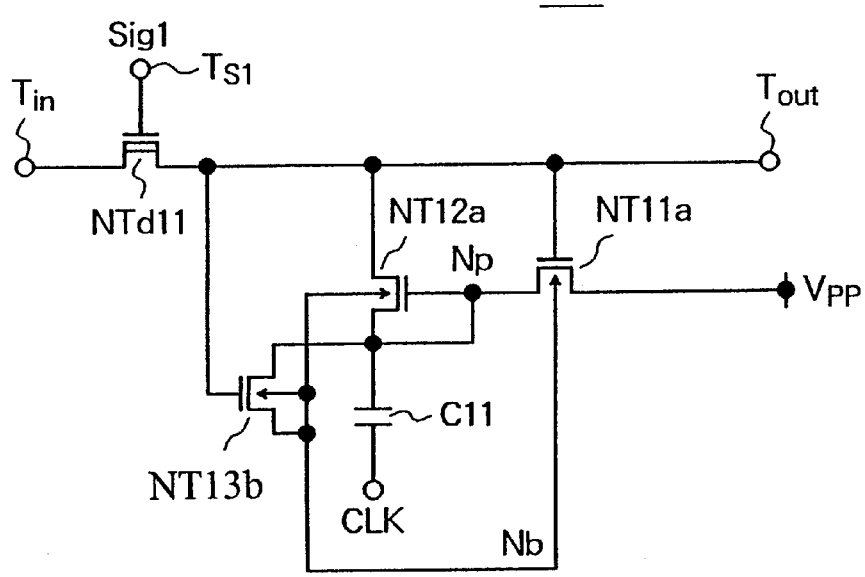
FIG. 7 is a circuit diagram of the fifth embodiment of the level shift circuit according to the present invention.

FIG. 7 is a circuit diagram of the fifth embodiment of the level shift circuit according to the present invention.

A different point of the fifth embodiment from the above third embodiment is, that instead of connecting NMOS transistor NT13b serving as a fourth field effect transistor composing the well potential adjusting circuit between the p-type well of each NMOS transistor NT11a, NT12a and NT13b and the output terminal T$_{out}$, connecting to the p-type well and one electrode of the capacitor C11 and a gate thereof to the output terminal T$_{out}$.

According to the fifth embodiment, the same effect can be obtained as the above first embodiment.

Sixth Embodiment

Figure 8:
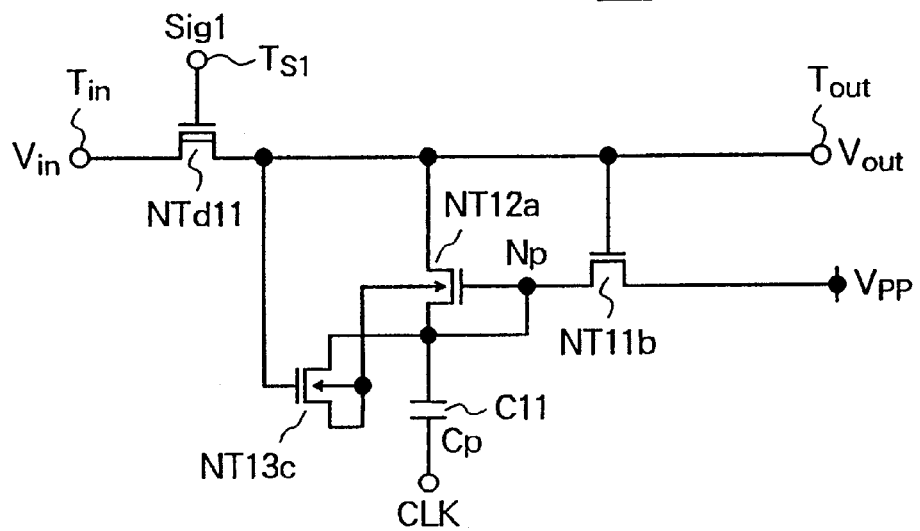
FIG. 8 is a circuit diagram of the sixth embodiment of the level shift circuit according to the present invention.

FIG. 8 is a circuit diagram of the sixth embodiment of the level shift circuit according to the present invention.

A different point of the sixth embodiment from the above fifth embodiment is that replacing the NMOS transistor serving as a third field effect transistor with a depletion type NMOS transistor NT11b.

Seventh Embodiment

Figure 9:
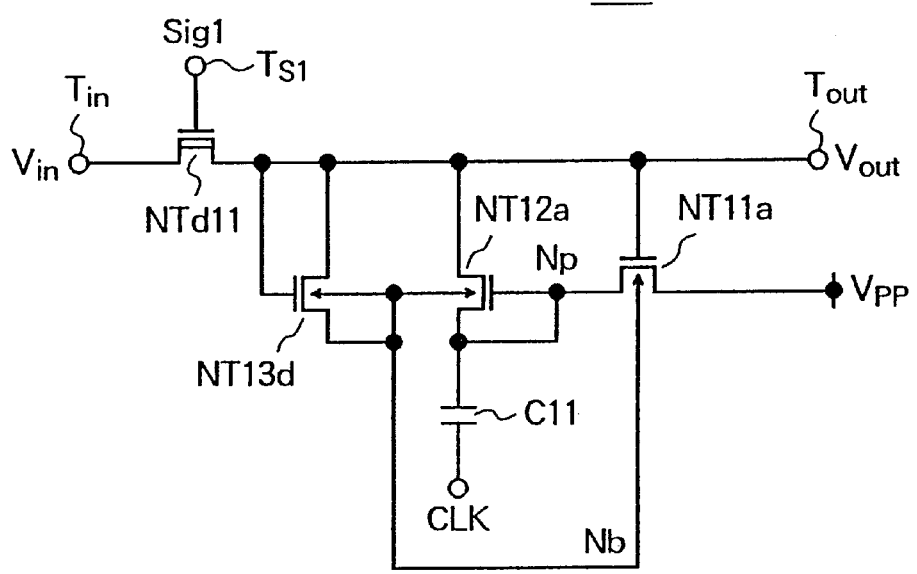
FIG. 9 is a circuit diagram of the seventh embodiment of the level shift circuit according to the present invention.

FIG. 9 is a circuit diagram of the seventh embodiment of the level shift circuit according to the present invention.

A different point of the seventh embodiment from the fourth embodiment is that instead of connecting the gate of the NMOS transistor NT13d serving as a fourth field effect transistor to one electrode of the capacitor C11, connecting the gate of the NMOS transistor NT13d to the output terminal T$_{out}$.

In this case, it meets the formula, VNb=V$_{out}$−V$_{th(NT13d)}$.

Also, it is possible to connect the transistors in two steps to lower only by twice the V$_{th}$.

The structure other than that is same as the fourth embodiment and the same effect can be obtained as the fourth embodiment.

Eighth Embodiment

Figure 10:
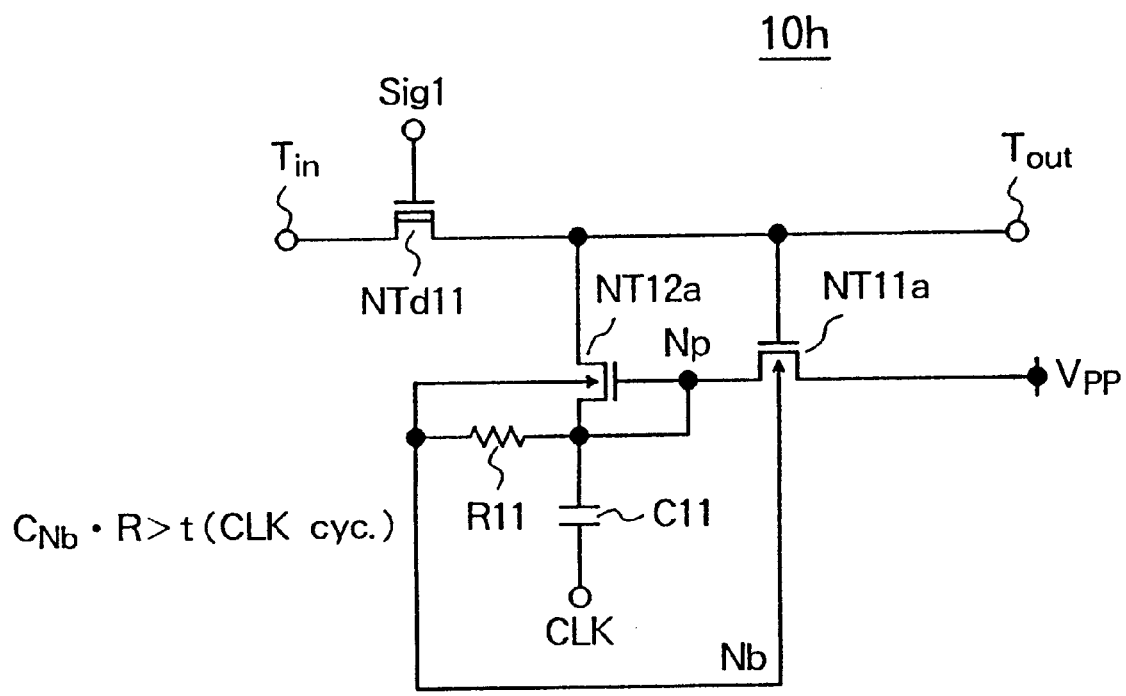
FIG. 10 is a circuit diagram of the eighth embodiment of the level shift circuit according to the present invention.
Figure 11:
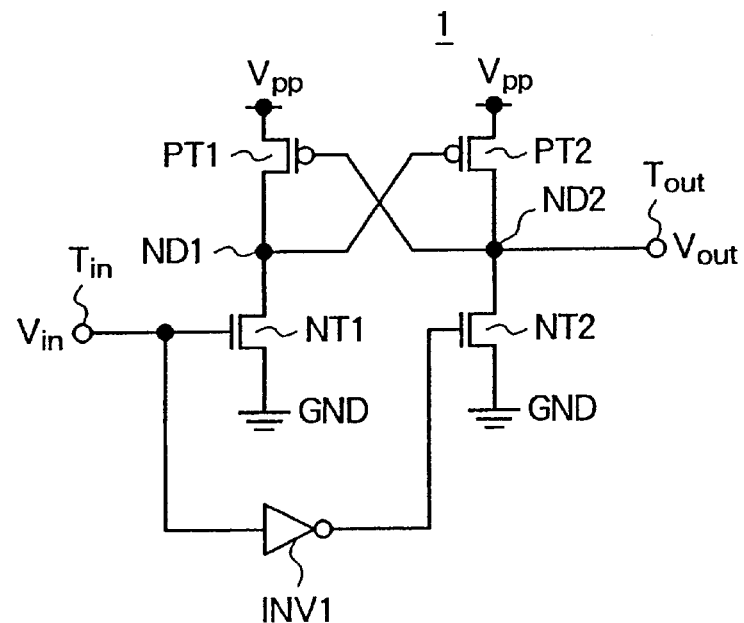
FIG. 11 is a circuit diagram of the configuration of the CMOS type level shift circuit.
Figure 12:
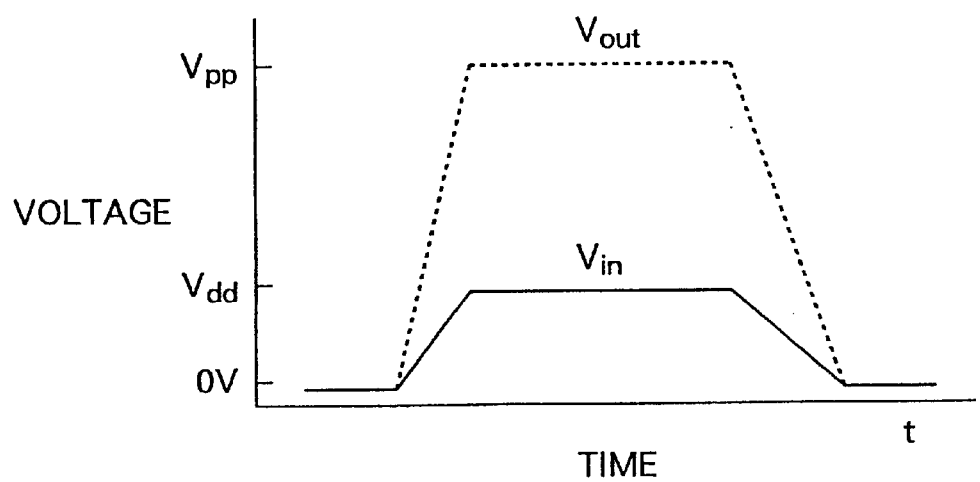
FIG. 12 is a view of the waveforms showing the input and output characteristics of the circuit of FIG. 11.

FIG. 10 is a circuit diagram of the eighth embodiment of the level shift circuit according to the present invention.

A different point of the eighth embodiment from the above first embodiment is that in place of the NMOS transistor serving as a composing element of the well potential adjustment circuit, a resistor element R11 is used.

The resistor element R11 is connected between one electrode of the capacitor C11 and the p-type well of the NMOS transistors NT11a, NT12a.

This structure is realized by setting the time Cnb (the volume of the node NB)×R sufficiently longer than the recycling time of the clock signal CLK.

According to the eighth embodiment, the same effect can be obtained as the first embodiment.

In the above embodiments, an example of using an n-type as conductive type has been explained, but the present invention may be achieved using a p-type, as well.

As explained above, according to the present invention, it is possible to avoid a back-bias effect, and there is an advantage that a level shift circuit capable of performing low voltage operation without increasing the power consumption can be realized. Note that the present invention is not limited to the above embodiments and includes modifications within the scope of the claims.

What is claimed is:

1. A level shift circuit for shifting a first voltage applied to an input terminal to a second, shifted voltage higher than the first voltage and then outputting said shifted voltage to an output terminal, comprising:

a first Field Effect Transistor (FET) of a first conductive type, having a first terminal connected to said input terminal and a second terminal connected to said output terminal;

a second FET of the first conductive type, having a first terminal connected to a capacitance element, a second terminal connected to said output terminal, and a gate connected to said capacitance element;

a third FET of the first conductive type, having a first terminal connected to the gate of said second FET, a second terminal connected to a voltage source, and a gate connected to said output terminal;

a well potential adjustment circuit connected to said output terminal and having a first well of the first conductive type;

said second FET having a second well of a second conductive type being formed in a first well of said second FET thereby being formed as a well-in-well type FET, wherein a pulse signal is applied to said capacitance element for the shifting of said first voltage, and said well potential adjustment circuit raising the potential of said second well in response to said second voltage at said output terminal.

2. A level shift circuit according to claim 1, wherein said first FET is a depletion type transistor.

3. A level shift circuit according to claim 1, wherein said third FET is a depletion type transistor.

4. A level shift circuit according to claim 2, wherein said third FET is a depletion type transistor.

5. A level shift circuit according to claim 1, wherein said well potential adjustment circuit comprises:

a fourth FET of the first conductive type connected between said voltage source and said second well of said second FET, and whose gate is connected to said output terminal.

6. A level shift circuit according to claim 2, wherein said well potential adjustment circuit comprises:

a fourth FET of the first conductive type connected between said voltage source and said second well of said second FET, and whose gate is connected to said output terminal.

7. A level shift circuit according to claim 5, wherein said fourth FET is formed with a second well of the second conductive type, which in turn is formed in a first well of said fourth FET of the first conductive type.

8. A level shift circuit according to claim 6, wherein said fourth FET is formed with a second well of the second conductive type, which in turn is formed in a first well of said fourth FET of the first conductive type.

9. A level shift circuit according to claim 2, wherein said well potential adjustment circuit comprises:
a fourth FET of the first conductive type connected to said voltage source, and whose gate is connected to said output terminal.

10. A level shift circuit according to claim 7 further comprising:
a depletion type fifth FET of the first conductive type connected between the second terminal of said third FET and the voltage source, and whose gate is connected to said output terminal.

11. A level shift circuit according to claim 9, wherein said fourth FET is formed with a second well of the second conductive type, which in turn is formed in a first well of said fourth FET of the first conductive type.

12. A level shift circuit according to claim 10, wherein said fourth FET is formed with a second well of the second conductive type, which in turn is formed in a first well of said fourth FET of the first conductive type.

13. A level shift circuit according to claim 2, wherein said well potential adjustment circuit comprises:
a fourth FET of the first conductive type connected to said second well of said second FET, and whose gate is connected to said output terminal.

14. A level shift circuit according to claim 9, further comprising:
a depletion type fifth FET of the first conductive type connected between said third FET and said voltage source, and whose gate is connected to said output terminal.

15. A level shift circuit according to claim 13, wherein said fourth FET is formed with a second well of the second conductive type, which in turn is formed in a first well of said fourth FET of the first conductive type.

16. A level shift circuit according to claim 14, wherein said fourth FET is formed with a second well of the second conductive type, which in turn is formed in a first well of said fourth FET of the first conductive type.

17. A level shift circuit according to claim 1, wherein said well potential adjustment circuit comprises:
a fourth FET connected between said voltage source and said second well of said second FET, and whose gate is connected to said output terminal.

18. A level shift circuit according to claim 2, wherein said well potential adjustment circuit comprises:
a fourth FET connected between said voltage source and said second well of said second FET, and whose gate is connected to said output terminal.

19. A level shift circuit according to claim 17, wherein said fourth FET is formed with a second well of the second conductive type, which in turn is formed in a first well of said fourth FET of the first conductive type.

20. A level shift circuit according to claim 18, wherein said fourth FET is formed with a second well of the second conductive type, which in turn is formed in a first well of said fourth FET of the first conductive type.

21. A level shift circuit according to claim 1,
wherein said level shift circuit is used in a memory device of single power source type,
said input terminal is a terminal to which said first voltage from an external power source is applied,
said output terminal is a terminal for an internal power source for using said second, shifted voltage at a converted level for a memory operation, and
said pulse signal for shifting said first voltage is applied to said capacitance element, wherein said pulse signal comprises a clock signal in said memory device.

22. A level shift circuit for shifting a first voltage applied to an input terminal to a second, shifted voltage higher than the first voltage and then outputting said shifted voltage to an output terminal, comprising:
a first Field Effect Transistor (FET) of a first conductive type, having a first terminal connected to said input terminal and a second terminal connected to said output terminal;
a second FET of the first conductive type, having a first terminal connected to a capacitance element, a second terminal connected to said output terminal, and a gate connected to said capacitance element;
a third FET of the first conductive type, having a first terminal connected to the gate of said second FET, a second terminal connected to a voltage source, and a gate connected to said output terminal;
said second FET having a second well of a second conductive type being formed in a first well of said second FET thereby being formed as a well-in-well type FET,
wherein a pulse signal is applied to said capacitance element for the shifting of said first voltage, and
a well potential adjustment circuit for raising the potential of said second well in response to said second voltage at said output terminal;
wherein said well potential adjustment circuit comprises a resistor connected between said capacitance element and said second well of said second FET.

23. A level shift circuit according to claim 22, wherein said first FET is a depletion type transistor.

* * * * *